(12) United States Patent
Turchin et al.

(10) Patent No.: US 11,422,155 B2
(45) Date of Patent: Aug. 23, 2022

(54) PROBE CARD HAVING DUMMY TRACES FOR TESTING AN INTEGRATED CIRCUIT TO BE INSTALLED IN A MULTICHIP-MODULE

(71) Applicant: Mellanox Technologies, Ltd., Yokneam (IL)

(72) Inventors: Konstantin Turchin, Yokneam Illit (IL); Israel Dadon, Haifa (IL); Ido Bourstein, Pardes Hana-Karkur (IL)

(73) Assignee: MELLANOX TECHNOLOGIES, LTD., Yokneam (IM)

( * ) Notice: Subject to any disclaimer, the term of this patent is extended or adjusted under 35 U.S.C. 154(b) by 204 days.

(21) Appl. No.: 16/423,204

(22) Filed: May 28, 2019

(65) Prior Publication Data

US 2020/0379006 A1    Dec. 3, 2020

(51) Int. Cl.
| G01R 1/04   | (2006.01) |
| G01R 31/28  | (2006.01) |
| G01R 1/073  | (2006.01) |
| G01R 31/26  | (2020.01) |
| G01R 31/3185 | (2006.01) |

(52) U.S. Cl.
CPC ....... G01R 1/0433 (2013.01); G01R 1/07342 (2013.01); G01R 31/2601 (2013.01); G01R 31/2853 (2013.01); G01R 31/318513 (2013.01)

(58) Field of Classification Search
CPC .............. G01R 1/0433; G01R 1/07342; G01R 31/2601; G01R 31/2853; G01R 31/318513; G01R 1/0408; G01R 31/2886
See application file for complete search history.

(56) References Cited

U.S. PATENT DOCUMENTS

| 4,972,580 A    | 11/1990 | Nakamura |
| 5,477,160 A *  | 12/1995 | Love ................. G01R 1/07314 324/756.02 |
| 5,679,609 A    | 10/1997 | Aimi et al. |
| 5,831,441 A    | 11/1998 | Motooka et al. |
| 6,914,259 B2   | 7/2005  | Sakiyama et al. |
| 7,998,853 B1 * | 8/2011  | Rahman ............ H01L 21/76898 438/618 |
| 2008/0126863 A1| 5/2008  | Co et al. |
| 2009/0289253 A1*| 11/2009 | Pendse ................. H01L 22/32 257/48 |

FOREIGN PATENT DOCUMENTS

WO    WO-2013004836 A1 *   1/2013    ..... G01R 31/318513

* cited by examiner

*Primary Examiner* — Jay Patidar
(74) *Attorney, Agent, or Firm* — Kligler & Associates Patent Attorneys Ltd

(57) ABSTRACT

An apparatus for testing an Integrated Circuit (IC) to be installed on a product substrate of a Multi-Chip Module (MCM) is disclosed. The apparatus includes a test substrate including (i) a first surface configured to receive the tested IC and at least an additional IC, (ii) a second surface that is opposite the first surface and is configured to receive electrical contacts, and (iii) first electrical traces for conveying electrical signals between the tested IC, the additional IC and the electrical contacts. The apparatus further includes a second electrical trace, which is formed in the test substrate instead of the additional IC and is configured to electrically connect between two of the first electrical traces.

12 Claims, 2 Drawing Sheets

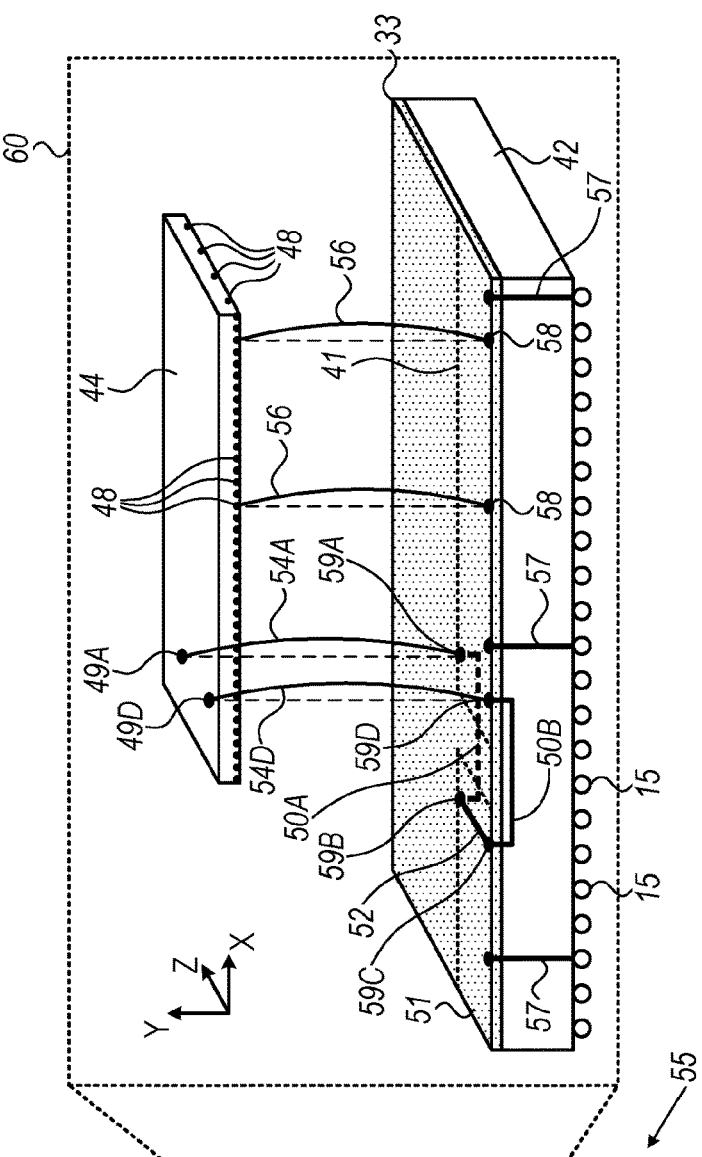
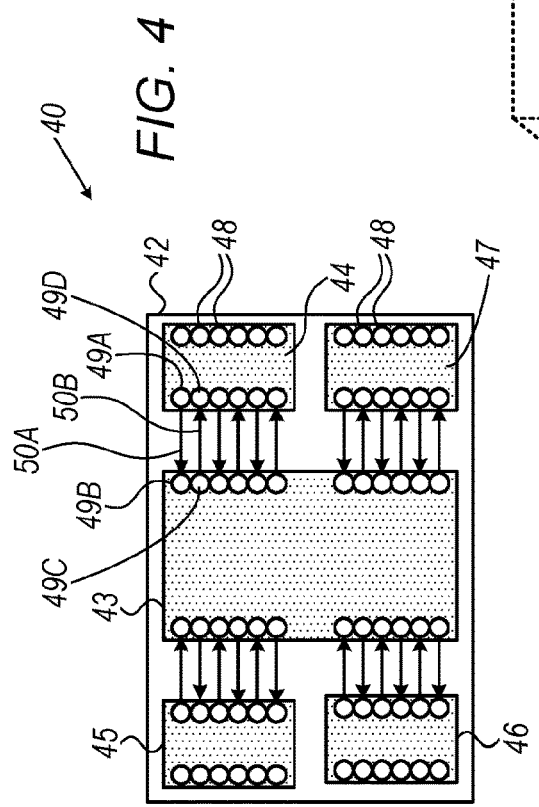
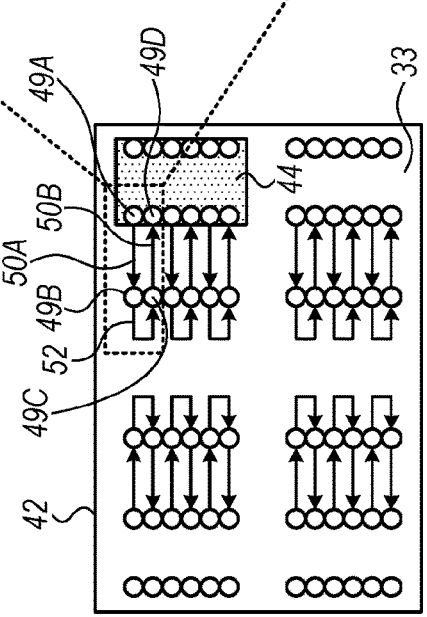
FIG. 4
FIG. 5

PROBE CARD HAVING DUMMY TRACES FOR TESTING AN INTEGRATED CIRCUIT TO BE INSTALLED IN A MULTICHIP-MODULE

FIELD OF THE INVENTION

The present invention relates generally to testing of electronic devices, and particularly to methods and systems for testing integrated circuits to be installed in a multichip module product.

BACKGROUND OF THE INVENTION

Various techniques for testing multichip semiconductor devices are known in the art.

For example, U.S. Pat. No. 6,914,259 describes a multichip module that is implemented by connecting a plurality of connection pads provided on, for example, two semiconductor chips via a plurality of conductive connecting members. To carry out a test for determining the quality of the connection between the two semiconductor chips, the multichip module is further provided with a plurality of switch elements so that the plurality of connecting members can be electrically conducted in a serial manner via the connection pads of the semiconductor chips. During the connection test, all the switch elements are turned on, and the impedance between both ends of the line including the plurality of connecting members conducted in a serial manner is measured using two probing pads.

U.S. Pat. No. 5,831,441 describes a test board used for testing a semiconductor device. The test board, which is provided with projection electrodes, includes a main board and testing electrodes. The testing electrodes are provided on the main board, each projecting upwardly from the main board. When the semiconductor device is tested, the testing electrodes are electrically connected to the projection electrodes by insertion of the testing electrodes into the projection electrodes. The semiconductor device is mounted on the main board to test the semiconductor device through the testing electrodes.

SUMMARY OF THE INVENTION

An embodiment of the present invention that is describe herein provides an apparatus for testing an Integrated Circuit (IC) to be installed on a product substrate of a Multi-Chip Module (MCM). The apparatus includes a test substrate including (i) a first surface configured to receive the tested IC and at least an additional IC, (ii) a second surface that is opposite the first surface and is configured to receive electrical contacts, and (iii) first electrical traces for conveying electrical signals between the tested IC, the additional IC and the electrical contacts. The apparatus further includes a second electrical trace, which is formed in the test substrate instead of the additional IC and is configured to electrically connect between two of the first electrical traces.

In an embodiment, the test substrate includes one or more organic layers. In some embodiments, the electrical contacts include balls, which are configured to conduct the electrical signals between the tested IC and an electrical testing system.

In an example embodiment, the second electrical trace is formed in one or more dummy layers disposed on the first surface. In an alternative embodiment, the apparatus includes a dummy die, which is assembled on the first surface instead of the additional IC, wherein the dummy die includes the second electrical trace. In a disclosed embodiment, the tested IC includes a transmitting port (Tx) and a receiving port (Rx), and the second electrical trace is configured to form a loop back by connecting between the Tx and Rx for testing the IC and the Tx and Rx.

In an embodiment, the first electrical traces include product traces configured to convey, in the MCM, functional electrical signals between the IC and the additional IC. In another embodiment, the second electrical trace includes a dummy trace, which is formed in the test substrate and is configured to convey testing electrical signals between two of the first electrical traces. In some embodiments, the test substrate includes the product substrate.

There is additionally provided, in accordance with an embodiment of the present invention, a method for producing an apparatus for testing an Integrated Circuit (IC) to be installed on a product substrate of a Multi-Chip Module (MCM). The method includes providing a test substrate that includes (i) a first surface for receiving the tested IC and at least an additional IC, (ii) a second surface that is opposite the first surface for receiving electrical contacts, and (iii) first electrical traces for conveying electrical signals between the tested IC, the additional IC and the electrical contacts. A second electrical trace is formed in the test substrate, instead of the additional IC, for electrically connecting between two of the first electrical traces.

The present invention will be more fully understood from the following detailed description of the embodiments thereof, taken together with the drawings in which:

BRIEF DESCRIPTION OF THE DRAWINGS

FIG. 4 is a schematic, pictorial illustration of a MCM, in accordance with another embodiment of the present invention; and FIG. 5 is a schematic, pictorial illustration of a probe card for testing an IC of the MCM of FIG. 4, in accordance with another embodiment of the present invention.

DETAILED DESCRIPTION OF EMBODIMENTS

Overview

Figure 1:
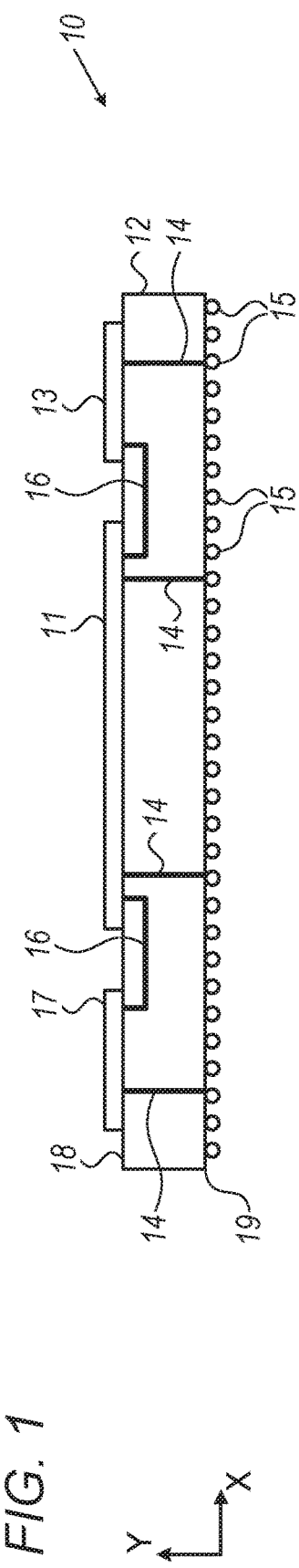
FIG. 1 is a schematic, sectional view of a Multi-Chip Module (MCM), in accordance with an embodiment of the present invention.

Electronic devices typically comprise one or more Integrated Circuits (ICs) mounted on a product substrate. Each of the ICs is electrically connected to the product substrate using any suitable electrical contacts, such as bumps, disposed on the IC. An electronic device may comprise, for example, a Multi-Chip Module (MCM). In a MCM, at least some of the bumps are used for internal connection between different ICs of the MCM, and are therefore, not connected directly to balls coupled to the product substrate.

Before being mounted on the product substrate, the ICs are typically electrically tested by being coupled to a test substrate, also referred to herein as a probe card. In principle, it is possible to design and produce a dedicated test substrate for testing a single type of IC, but the test substrate and the routing of electrical signals, may differ from that of a product substrate and therefore may affect the quality and reliability of the testing. Moreover, design, production and inventory management of dedicated test substrates may increase the overall cost of testing.

Embodiments of the present invention that are described hereinbelow provide techniques for improving the quality, reliability and cost of testing an IC to be installed in a MCM. In some embodiments, a probe card (PC) for testing the IC is coupled to an electrical testing system and is configured to electrically connect between the tested IC and the electrical testing system.

The PC comprises a test substrate, which is based on, and therefore substantially similar to (e.g., identical to), a product substrate of the MCM. The test substrate comprises a first surface, which is configured to receive the tested IC and at least one additional IC. The test substrate further comprises a second surface that is facing opposite to the first surface and is configured to receive electrical contacts, such as balls.

In some embodiments, the probe card comprises an array of flexible electrically-conductive pins, which are configured to engage with bumps or other contacts disposed on the tested IC. The probe card further comprises multiple electrical traces, patterned in the test substrate and configured to route electrical signals between the tested IC and the electrical testing system, via the aforementioned bumps and balls.

In some embodiments, the electrical traces may comprise a combination of electrical conductors laid out in parallel to the first surface, and vias, which are electrical conductors laid out orthogonally to the first surface. The test substrate comprises first electrical traces, also referred to herein as product traces, for conveying electrical signals between the tested IC, the additional IC and the balls.

In some embodiments, the test substrate comprises a second electrical trace, also referred to herein as a dummy trace, which is formed in the test substrate instead of the additional IC, and is configured to electrically connect between two of the product traces. Note that the product traces are pre-formed in the product substrate and are configured to conduct functional electrical signals of the MCM, whereas the dummy trace is produced only on the test substrate, and is configured to form an electrical short between two of the product traces and to convey testing electrical signals, so as to replace the additional IC, which is not mounted on the test substrate.

In some embodiments, the test substrate may comprise a dummy die, which is assembled on the first surface instead of the additional IC. The dummy die may comprise one or more electrically insulating layers and the electrically conductive dummy trace. In other embodiments, the test substrate may comprise the electrically conductive dummy trace, which is patterned in one or more electrically insulating layers disposed on the first surface.

In some embodiments, the IC comprises a transmitting port (Tx) and a receiving port (Rx), and the dummy trace is configured to form a loopback connecting between the Tx and Rx, so as to test the IC and the Tx and Rx.

The disclosed techniques can be used for improving the quality and reliability of IC testing and for reducing the overall cost of testing various types of MCMs, integrated in a two-dimensional (2D) structure or stacked in a three-dimensional (3D) structure.

System Description

FIG. 1 is a schematic, sectional view of a Multi-Chip Module (MCM), referred to herein as a MCM 10, in accordance with an embodiment of the present invention. In some embodiments, MCM 10 comprises a substrate 12 made from one or more organic layers of a printed circuit board (PCB) or from any other suitable material. In some embodiments, substrate 12 has a first surface 18, also referred to herein as a surface 18 for brevity, which is configured to receive multiple integrated circuits (ICs), such as ICs 11, 13 and 17 mounted thereon. In the context of the present invention and in the claims, IC 11 is also referred to herein as "tested IC" and ICs 13 and 17 are also referred to herein as "additional ICs."

In some embodiments, substrate 12 has a second surface 19, also referred to herein as a surface 19 for brevity, which is opposite surface 18 and is configured to receive multiple electrical contacts, in the present example one or more balls 15 made from any suitable electrically-conductive materials. In some embodiments, substrate 12 of MCM 10 further comprises multiple electrical conductors laid out along x-axis and y-axis. In some publications, the conductors along the y-axis are denoted "vias" but for the sake of simplicity and ease of explanation, in the context of the present invention and in the claims, both electrical conductors in x and y axes are referred to herein as "traces" or "trace."

In the example of FIG. 1, substrate 12 comprises electrical traces 14 interconnecting between ICs 11, 13 and and balls 15 along y-axis, and electrical traces 16 interconnecting only between ICs 11, 13 and 17 along both x and y axes.

In some embodiments, MCM 10 further comprises bumps (shown in FIG. 2 below), which are disposed between surface 18 and at least one of ICs 11, 13 and 17. The bumps are typically formed on the ICs in a wafer-level packaging process, and are configured to electrically connect between the ICs and electrical traces described above.

In the configuration of MCM 10, balls 15 are directly coupled to electrical traces 14, and are configured to conduct electrical signals between ICs 11, 13 and 17 and one or more electronic assemblies external to MCM 10. Electrical traces 16, however, are connecting between the bumps formed on ICs 11, 13 and 17, and therefore the functionality of the electrical signals conveyed in electrical traces 16, may not be monitored directly, but only via electrical traces 14.

Probcard for Testing Integrated Circuit of a Multichip Module

Figure 2:
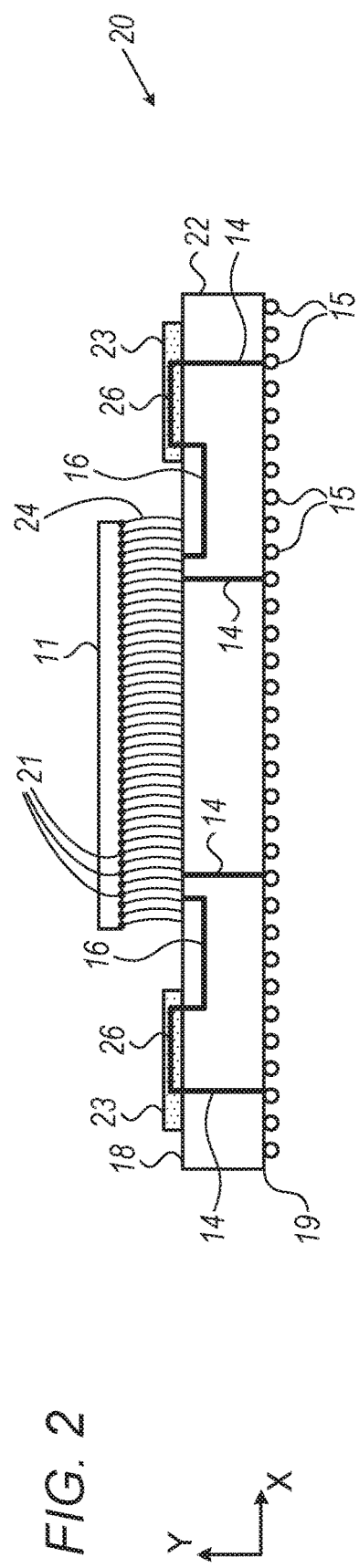
FIGS. 2 and 3 are schematic, sectional views of probe cards for testing an Integrated Circuit (IC) to be installed on the surface of the MCM of FIG. 1, in accordance with embodiments of the present invention.

FIG. 2 is a schematic, sectional view of a probe card (PC) 20, in accordance with an embodiment of the present invention. In some embodiments, PC 20 is mounted on an electrical testing system (not shown), and is configured to electrically connect between the electrical testing system and IC 11 for testing the functionality of IC 11.

The electrical testing may be used, for example, for sorting between functional and non-functional ICs 11. Subsequently, functional ICs 11 will be mounted on surface 18 of MCM 10, as described in FIG. 1 above.

In some embodiments, PC 20 comprises a substrate 22, which is based on, and therefore is substantially similar to, substrate 12 of MCM 10. Note that using the substrate and routing scheme of the final product (e.g., substrate 12 of MCM 10) improves the quality and reliability of the electrical testing and also reduces the cost associated with designing and manufacturing a dedicated probe card. In such embodiments, PC 20 comprises electrical traces 14 and 16, also referred to herein as product traces, and balls 15 described in FIG. 1 above. In the configuration of PC 20, balls 15 are configured to conduct electrical signals between tested IC 11 and the electrical testing system.

In some embodiments, PC 20 comprises an array of electrically-conductive flexible pins 21, which are coupled to surface 18 and are configured to make physical contact with bumps 21 of IC 11, so as to perform the electrical testing described above. Note that the electrical signals conveyed in electrical traces 14 are testable via balls 15. As described in FIG. 1 above, the electrical signal conveyed by electrical traces 16 are conducted between the ICs of MCM 10, and therefore may be considered as "internal electrical signals" of MCM 10. In the absence of ICs 13 and 17 the internal electrical signals may be "trapped" within substrate 12, and therefore are not testable.

In some embodiments, PC 20 comprises dummy dies 23, also referred to herein as daisy-chain dummy dies, attached on surface 18 instead of ICs 13 and 17. Each of dummy dies comprises one or more electrical traces 26, also referred to herein as dummy traces, which makes an electrical short between electrical traces 14 and 16 and are configured to convey testing electrical signals therebetween. Each of dummy dies 23 may further comprise one or more other suitable layers, typically comprising non-conductive materials such as but not limited to polymers, ceramics or other suitable materials.

In some embodiments, dummy dies 23 may have any suitable dimensions, such as the same dimensions of ICs 13 and 17, and electrical traces 26 have a geometrical structure that fits to make an electrical contact with the respective electrical traces 14 and 16 of PC 20.

In an electrical testing process of IC 11, the electrical testing system moves PC 20 along y-axis so that pins 21 make a physical contact with bumps 21. Subsequently, the electrical testing system conducts, via PC 20, input electrical signal into IC 11, and measures output electrical signals received from IC 11.

In some embodiments, substrate 22 may comprise substrate 12 and may have additional structural elements, such as dummy dies 23 and electrical traces 26, coupled to or formed in substrate 22 as described above.

Figure 3:
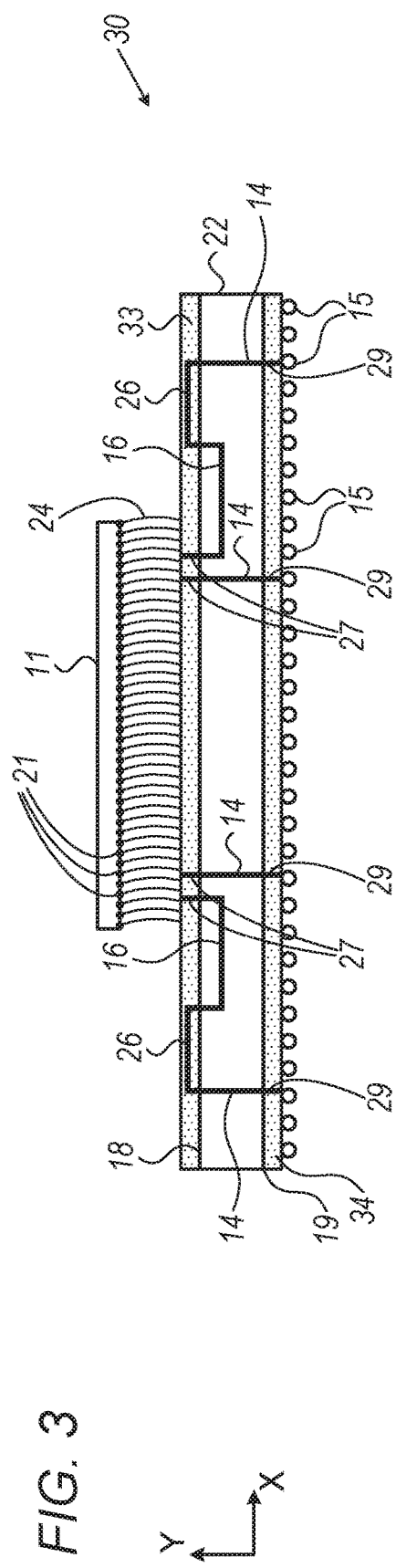

FIG. 3 is a schematic, sectional view of a probe card (PC) 30, in accordance with another embodiment of the present invention. PC 30 may replace, for example, PC 20 of FIG. 2 above. In some embodiments, PC 30 is mounted on the electrical testing system, and is configured to electrically connect between the electrical testing system and IC 11 for testing the functionality of IC 11 as described above.

In some embodiments, PC 30 comprises substrate 22, electrical traces 14 and 16, pins 24 and balls 15 described above, and dummy layers 33 and 34 formed on surfaces 18 and 19, respectively. In some embodiments, dummy layer 33 comprises one or more electrically insulating sublayers, and a few conducting electrical traces, such as electrical traces 26 described above, and electrical traces 27 that make electrical shorts between pins 24 and electrical traces 14 and 16. In some embodiments, dummy layer 34 comprises one or more electrically insulating sublayers, and electrical traces 29 that make electrical shorts between balls 15 and electrical traces 14. The sublayers of dummy layers 33 and 34 may be similar to or different from one another, and electrical traces 27 and 29 are typically made from the same materials and may have similar width (measured along x-axis) and similar or different length (measured along y-axis).

These particular configurations of probe cards 20 and 30 are shown by way of example, in order to illustrate certain problems that are addressed by embodiments of the present invention and to demonstrate the application of these embodiments in enhancing the performance of such probe cards of an electrical testing system. Embodiments of the present invention, however, are by no means limited to this specific sort of example system, and the principles described herein may similarly be applied to other sorts of probe cards for testing any other types of multichip packages. For example, the techniques described above may be implemented, mutatis mutandis, in electrical testing of a vertically stacked MCM, e.g., by replacing at least one of the stacked ICs with one or more electrical conductors, or in any other configuration of MCM. In some embodiments, substrate 22 may comprise substrate 12 and may have additional structural elements, such as dummy layer 33 and electrical traces 26, coupled to or formed in substrate 22 as described above.

FIG. 4 is a schematic, top-view of a MCM product, referred to herein as a MCM 40, in accordance with an embodiment of the present invention. In some embodiments, MCM 40 comprises a substrate 42 made from one or more organic layers of a PCB or from any other suitable material.

In some embodiments, MCM 40 comprises five ICs 43, 44, 45, 46 and 47, each of which having bumps 48, which may be similar to bumps 21 of IC 11 described in FIGS. 1 and 2 above. In the example of FIG. 4, IC 44 comprises a transmitting port (Tx) implemented using a bump 49A and a receiving port (Rx), implemented using a bump 49D. Similarly, IC 43 comprises a Rx, implemented using a bump 49B, and a Tx, implemented using a bump 49C.

In the context of the present invention and in the claims, IC 44 is also referred to herein as "tested IC" and ICs 43, 45, 46 and 47 are also referred to herein as "additional ICs."

Note that bumps 49A-49D are substantially identical to bumps 48, and have different numerals only for the sake of description. Moreover, bumps 48 and 49A-49D are disposed between ICs 43-47 and substrate 42, and therefore are not visible in top view, but are shown in FIGS. 4 and 5 for the description of the disclosed embodiments.

In some embodiments, MCM 40 comprises balls (shown in FIG. 5 below), which are similar to balls 15 of MCM 10 shown in FIG. 1 above, and are formed on the bottom surface of substrate 42, as shown in FIG. 5 below. In an embodiment, substrate 42 comprises electrical conductors (shown in FIG. 5 below), which are similar to electrical traces 14 of substrate 12 shown in FIG. 1 above. As in MCM 10, these electrical traces are used for electrically connecting between the balls of substrate 42 and the bumps of ICs 43-47.

In an embodiment, substrate 42 comprises product electrical traces, such as electrical traces 50A and 50B, which are similar to electrical traces 16 of FIG. 1 above, and are used for conducting functional electrical signals between ICs 43-47.

In the example of FIG. 4, ICs 44 and 43 may comprise transceivers, e.g., serializer/deserializer (SerDes) ICs, such that electrical trace 50A conducts electrical signals transmitted from the Tx of IC 44, implemented as bump 49A, to the Rx of IC 43, implemented as bump 49B. Similarly, electrical trace 50B conducts electrical signals transmitted from the Tx of IC 43, implemented as bump 49C, to the Rx of IC 44, implemented as bump 49D.

In some embodiments, the configuration of MCM 40 forms an electrical circuit that flows electrical signals in a counterclockwise direction between bumps 49A-49D. In these embodiments, first electrical signals are transmitted from bump 49A of IC 44, via electrical trace 50A, and received by bump 49B of IC 43, and second electrical signals are transmitted from bump 49C of IC 43, via electrical trace 50B, and received by bump 49D of IC 44. The first and second electrical signals may be similar to or different from one another.

Loopback for Testing a Transceiver Integrated Circuit to be Installed in a Multichip Module FIG. 5 is a schematic, pictorial illustration of a probe card (PC) 55, which is configured to test IC 44 to be installed on substrate 42 of MCM 40, in accordance with another embodiment of the present invention. In some embodiments, PC 55 comprises substrate 42, which is depicted in detail in FIG. 4 above, and an additional electrical trace 52, also referred to herein as a dummy trace, which is formed in substrate 42 along the z-axis.

In some embodiments, electrical trace 52 makes an electrical short, and is configured to convey testing electrical signals, between the designed Tx and Rx positions of IC 43 of MCM 40. In the example of inset 60, the designed Tx and Rx are shown as bumps 49B and 49C. Note that since PC 55 is a testing probe card, IC 43 is not mounted on PC 55, and therefore, bumps 49B and 49C are not actually formed on substrate 42. In an embodiment, electrical trace 52 is formed on substrate 42 instead of mounting a fully-functional IC 43, so as to make an electrical short between 50A and 50B, as will be described in detail below.

Reference is now made to an inset 60, which is a schematic illustration of MCM 40 both in a top view and sectional view. In some embodiments, PC 55 comprises a layer 33, which is typically made from multiple electrically insulating sublayers as described in FIG. 3 above. In some embodiments, each of electrical traces 50A and 50B is laid out along the x-axis and y-axis, and electrical trace 52 is laid out along the z-axis between electrical traces 50A and 50B, and is configured to electrically connect therebetween. Electrical trace 52 may be embedded within layer 33, or disposed between substrate 42 and layer 33, or disposed on top of layer 33.

In some embodiments, PC 55, which is based on MCM 40 of FIG. 4 above, comprises electrical traces 57, which are substantially similar to electrical traces 14 shown in FIG. 2 above, or to electrical traces 14, 27 and 29 shown in FIG. 3 above. In such embodiments, electrical traces 57 are configured to conduct electrical signals, for example, between IC 44 and balls 15 described in FIG. 1 above.

Note that in PC 55, electrical traces 50A, 50B and 57 are functional electrical conductors that also part of MCM 40 of FIG. 4 above, and are configured to conduct electrical signals in an electrical product that comprises MCM 40. However, one or more electrical traces 52 of PC 55, are test electrical conductors formed for conducting test signals, and therefore not part of MCM 40. As described above, one or more electrical traces 52 are formed in PC 55 instead of ICs 43, 45, 46 and 47, and are configured to electrically connect between two or more of the functional electrical conductors, such as electrical traces 50A and 50B, for the electrical testing of IC 44.

As described in FIG. 4 above, ICs 43 and 44 of MCM 40 may comprise an electrical circuit comprising bumps 49A-49D and electrical traces 50A and 50B. In some embodiments, PC 55 is configured to conduct electrical signals between IC 44 and the electrical testing system so as to test IC without having IC 43 mounted on substrate 42. Specifically, the configuration of PC 55 enables the functional testing of IC 44 and bumps 49A and 49D of the aforementioned electrical circuit.

In such embodiments, PC 55 conducts electrical signals between IC 44 and the electrical testing system, so as to test at least the functionality of (a) transmission and reception functions of IC 44, and (b) bumps 49A and 49D, which constitute the respective Tx and Rx of IC 44. In this configuration, electrical traces 50A, 50B, and 52 are configured to complete the aforementioned electrical circuit without having IC 43 on substrate 42, so as to enable the electrical testing thereof.

In some embodiments, IC 43 in not mounted on PC 55, and electrical trace 52 forms a loopback between the Tx and Rx of IC 44 by forming an electrical short between electrical traces 50A and 50B. As shown in the exemplary simplified configuration of FIG. 5, PC 55 is configured to test multiple (e.g., three) separate electrical circuits between each pair of ICs.

Mounting regions 41 and 51 are illustrated in inset for showing the positions designated, in some embodiments, for mounting ICs 44 and 43, respectively. Note that in PC 55, electrical trace 52 is replacing IC 43, and layer 33 does not make direct physical contact with IC 44, as will be described below.

As described above, PC 55 comprises substrate 42, which is the substrate of MCM 40 and may have additional structural elements, such as dummy layer 33 and electrical traces 52, which are coupled to or formed in substrate 42 of PC 55. In other words, the test substrate of PC 55 comprises the product substrate of MCM 40, and having the aforementioned additional structural elements, or any other suitable elements for the testing of IC 44.

As described in FIG. 4 above, IC 44 comprises bumps 48, 49A and 49D, which are identical or substantially similar to one another and are formed on the surface of IC 44, so as to conduct electrical signals between IC 44 and the electrical traces formed in substrate 42. In some embodiments, mounting region 41 comprises points 58, 59A and 59D, that are indicative of the respective landing positions of bumps 48, 49A and 49D, on the surface of substrate 42. Similarly, mounting region 51 comprises points 59B and 59C, which are indicative of the respective landing positions of bumps 49B and 49C of IC 43 (shown in FIG. 4 above) on the surface of substrate 42.

In some embodiments, PC 55 comprises an array of electrically-conductive flexible pins, such as pins 56, 54A and 54D, which may be similar to or different from pins 24 shown in FIGS. 2 and 3 above. In some embodiments, pins 56, 54A and 54D, which are substantially similar to one another, are coupled to points 58, 59A and 59D, respectively, and are configured to make physical contact with respective bumps 48, 49A and 49D of IC 44, so as to perform the electrical testing described above. Note that the number of flexible pins 56, 54A and 54D is shown by way of example for the sake of conceptual clarity, and in other embodiments, PC 55 may comprise any other suitable number of flexible pins, e.g., similar to the number of bumps formed on IC 44.

In some embodiments, PC 55 is coupled to an electrical testing system (not shown), which is configured to move PC 55 along the x and z axes so as to position pins 56, 54A and 54D in front of respective bumps 48, 49A and 49D. The electrical testing system is further configured to move PC 55 along the y-axis for engaging and disengaging between pins 56, 54A and 54D and bumps 48, 49A and 49D, respectively.

In some embodiments, when applying an electrical testing procedure to a given IC 44, the electrical testing systems engages pins 56, 54A and 54D with respective bumps 48, 49A and 49D of given IC 44, and exchanges electrical signals with given IC 44, via PC 55.

After concluding the electrical testing of given IC 44, the electrical testing system retracts PC 55 along the y-axis, so as to disengage pins 56, 54A and 54D from respective bumps 48, 49A and 49D. Based on the output results obtained in the electrical testing, the electrical testing system determines whether or not given IC 44 complies with the specified electrical parameters, and loads a subsequent IC 44 for repeating the electrical testing procedure described above.

This particular configuration of probe card 55 is shown by way of example, in order to illustrate certain problems, such as performing a reliable electrical testing of a single IC to be implemented in a MCM. These problems are addressed by embodiments of the present invention and demonstrate the application of these embodiments in enhancing the performance of a MCM. Embodiments of the present invention, however, are by no means limited to this specific sort of probe card, and the principles described herein may similarly be applied to other sorts of apparatus for electrically testing any suitable type of IC to be installed on a product substrate of any suitable type of MCM.

Although the embodiments described herein mainly address electrical testing for sorting ICs to be installed in an MCM, the methods and systems described herein can also be used in other applications.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus for testing a first Integrated Circuit (IC) to be installed on a product substrate of a Multi-Chip Module (MCM), the product substrate of the MCM being separate from the apparatus, the apparatus comprising:
    a test substrate, which is based on the product substrate of the MCM, the test substrate comprising:
        a first surface configured to receive the first IC at a first location on the first surface and at least one dummy element corresponding to a second IC of the product substrate, at a second location on the first surface, the second location corresponding to the location of the second IC of the product substrate;
        a second surface that is opposite the first surface and is configured to have electrical contacts;
        multiple product-traces for conveying electrical signals between (i) the first IC and the at least one dummy element, (ii) the at least one dummy element and the electrical contacts, and, (iii) the first IC and the electrical contacts;
        the at least one dummy element further comprising one or more dummy layers; and
        a dummy-trace formed in the one or more dummy layers disposed on the first surface, which is:
            (i) formed only on the test substrate and not on the product substrate of the MCM;
            (ii) located on the first surface at the second location; and
            (iii) configured to electrically connect the product-traces that are used for conveying electrical signals to the at least one dummy element.

2. The apparatus according to claim 1, wherein the test substrate comprises one or more organic layers.

3. The apparatus according to claim 1, wherein the electrical contacts comprise balls, which are configured to conduct the electrical signals between the first IC and an electrical testing system.

4. The apparatus according to claim 1, wherein the first IC comprises a transmitting port (Tx) and a receiving port (Rx), and wherein the dummy-trace is configured to form a loop back by connecting between the Tx and Rx for testing the first IC.

5. The apparatus according to claim 1, wherein at least one of the multiple product-traces correspond to at least one of the product traces in the MCM, that is configured to convey functional electrical signals between the first IC and the second IC.

6. A method for producing an apparatus for testing a first Integrated Circuit (IC) to be installed on a product substrate of a Multi-Chip Module (MCM), the product substrate of the MCM separate from the apparatus, the method comprising:
    providing a test substrate, which is based on the product substrate of the MCM, the test substrate comprising:
        a first surface configured to receive the first IC at a first location on the first surface and at least one dummy element corresponding to a second IC of the product substrate, at a second location on the first surface, the second location corresponding to the location of the second IC of the product substrate; and
        a second surface that is opposite the first surface and is configured to have electrical contacts;
        multiple product-traces for conveying electrical signals between (i) the first IC and the dummy element, (ii) the dummy element and the electrical contacts, and, (iii) the first IC and the electrical contacts; and
        the at least one dummy element further comprising one or more dummy layers; and
    forming a dummy-trace comprising: disposing the one or more dummy layers on the first surface and forming the dummy-trace in the one or more dummy layers, only on the test substrate, wherein the dummy-trace:
        (i) is located on the first surface at the second location; and
        (ii) electrically connects between the product-traces that are used for conveying electrical signals to the at least one dummy element.

7. The method according to claim 6, wherein the test substrate comprises one or more organic layers.

8. The method according to claim 6, wherein the electrical contacts comprise balls for conducting the electrical signals between the first IC and an electrical testing system.

9. The method according to claim 6, wherein the first IC comprises a transmitting port (Tx) and a receiving port (Rx), and wherein forming the dummy-trace comprises forming a loop back by connecting between the Tx and Rx for testing the first IC.

10. The method according to claim 6, wherein at least one of the multiple product-traces correspond to at least one of the product traces in the MCM, that is configured for conveying functional electrical signals between the first IC and the second IC.

11. An apparatus for testing a first Integrated Circuit (IC) to be installed on a product substrate of a Multi-Chip Module (MCM), the product substrate of the MCM being separate from the apparatus, the apparatus comprising:
   a test substrate, which is based on the product substrate of the MCM, the test substrate comprising:
      a first surface configured to receive the first IC at a first location on the first surface and at least one dummy element, the at least one dummy element including a dummy layer along the first surface, the at least one dummy element corresponding to a second IC of the product substrate, at a second location on the first surface, the second location corresponding to the location of the second IC of the product substrate;
      a second surface that is opposite the first surface and is configured to have electrical contacts; and
      multiple product-traces for conveying electrical signals between (i) the first IC and the at least one dummy element, (ii) the at least one dummy element and the electrical contacts, and, (iii) the first IC and the electrical contacts; and
      a dummy trace which is:
         (i) formed only on the test substrate and not on the product substrate of the MCM;
         (ii) located on the first surface at the second location; and
         (iii) configured to electrically connect the product-traces that are used for conveying electrical signals to the at least one dummy element.

12. A method for producing an apparatus for testing a first Integrated Circuit (IC) to be installed on a product substrate of a Multi-Chip Module (MCM), the product substrate of the MCM separate from the apparatus, the method comprising:
   providing a test substrate, which is based on the product substrate of the MCM, the test substrate comprising:
      a first surface configured to receive the first IC at a first location on the first surface and at least one dummy element including a dummy layer along the first surface, the at least one dummy element corresponding to a second IC of the product substrate, at a second location on the first surface, the second location corresponding to the location of the second IC of the product substrate;
      a second surface that is opposite the first surface and is configured to have electrical contacts; and
      multiple product-traces for conveying electrical signals between (i) the first IC and the dummy element, (ii) the dummy element and the electrical contacts, and, (iii) the first IC and the electrical contacts; and
   forming a dummy-trace only on the test substrate, wherein the dummy-trace:
      (i) is located on the first surface at the second location; and
      (ii) electrically connects between the product-traces that are used for conveying electrical signals to the at least one dummy element.

* * * * *